(12) United States Patent
Manepalli et al.

(10) Patent No.: US 12,159,825 B2
(45) Date of Patent: Dec. 3, 2024

(54) DIELECTRIC-TO-METAL ADHESION PROMOTION MATERIAL

(71) Applicant: Intel Corporation, Santa Clara, CA (US)

(72) Inventors: Rahul Manepalli, Chandler, AZ (US); Suddhasattwa Nad, Chandler, AZ (US); Marcel Wall, Phoenix, AZ (US); Darko Grujicic, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 757 days.

(21) Appl. No.: 17/197,531

(22) Filed: Mar. 10, 2021

(65) Prior Publication Data

US 2022/0293509 A1 Sep. 15, 2022

(51) Int. Cl.
| | |
|---|---|
| *H01L 23/495* | (2006.01) |
| *H01L 21/48* | (2006.01) |
| *H01L 23/00* | (2006.01) |
| *H01L 23/498* | (2006.01) |

(52) U.S. Cl.
CPC .... *H01L 23/49894* (2013.01); *H01L 21/4857* (2013.01); *H01L 23/49822* (2013.01); *H01L 24/16* (2013.01); *H01L 2224/16225* (2013.01)

(58) Field of Classification Search
CPC .................. H01L 23/43894; H01L 23/49822
USPC .................................................. 257/773, 786
See application file for complete search history.

(56) References Cited

U.S. PATENT DOCUMENTS

| | | | | | |
|---|---|---|---|---|---|
| 4,855,213 | A | * | 8/1989 | Logan ...................... | G03C 1/22 |
| | | | | | 549/426 |
| 5,919,492 | A | * | 7/1999 | Tarr .................... | B29C 45/2806 |
| | | | | | 425/572 |
| 6,324,067 | B1 | * | 11/2001 | Nishiyama ............. | H05K 1/183 |
| | | | | | 428/209 |
| 7,638,877 | B2 | * | 12/2009 | Jomaa ................... | H01L 23/498 |
| | | | | | 257/773 |
| 9,330,993 | B2 | * | 5/2016 | Bai ........................ | H01L 23/293 |
| 9,466,544 | B2 | * | 10/2016 | Uehling .................. | H01L 23/29 |

(Continued)

FOREIGN PATENT DOCUMENTS

WO 2015023295 2/2015

OTHER PUBLICATIONS

Extended European Search Report for EP Patent Application No. 22156114.5, dated Aug. 5, 2022.

(Continued)

*Primary Examiner* — Nitin Parekh
(74) *Attorney, Agent, or Firm* — Essential Patents Group, LLP

(57) ABSTRACT

An electronic substrate may be formed having at least one metal-to-dielectric adhesion promotion material layer therein. The electronic substrate may comprise a conductive metal trace, a dielectric material layer on the conductive metal trace, and the adhesion promotion material layer between the conductive metal trace and the dielectric material layer, wherein the adhesion promotion material layer comprises an organic adhesion material and a metal constituent dispersed within the organic adhesion material, wherein a metal within the metal constituent has a standard reduction potential greater than a standard reduction potential of the conductive metal trace.

20 Claims, 8 Drawing Sheets

(56) References Cited

U.S. PATENT DOCUMENTS

| | | | |
|---|---|---|---|
| 2003/0160325 A1* | 8/2003 | Yoneda | H01L 23/3121 |
| | | | 257/E23.008 |
| 2005/0039840 A1* | 2/2005 | Foster | H01L 21/4846 |
| | | | 156/151 |
| 2012/0168075 A1 | 7/2012 | Abys et al. | |
| 2018/0245177 A1* | 8/2018 | Jalbout | C22B 3/02 |
| 2021/0108324 A1* | 4/2021 | Chen | C25D 3/64 |

OTHER PUBLICATIONS

Kovacevic, N., et al., "DFT Study of Interaction of Azoles with Cu(111) and Al(111) Surfaces: Role of Azole Nitrogen Atoms and Dipole—Dipole Interactions", Journal of Physical Chemistry, C 2011, 115, 24189-24197.

\* cited by examiner

DIELECTRIC-TO-METAL ADHESION PROMOTION MATERIAL

TECHNICAL FIELD

Embodiments of the present description generally relate to the field of integrated circuit package or assembly fabrication, and, more specifically, to the fabrication of electronic substrates used to route electrical signals for integrated circuit packages or assemblies.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like. These integrated circuit devices and packages generally include at least one integrated circuit die, such as a silicon die having integrated circuitry formed therein, that may be physically and electrically attached to an electronic substrate, such that conductive routes in the electronic substrate appropriately routes electrical signals to and from the integrated circuitry of the integrated circuit device(s).

As the goals of the integrated circuit industry are achieved, higher speed and higher density of input/output routing from the electronic substrates are required. In one example, higher speed input/output data transfer is an essential requirement in enabling the support for serializer/deserializer (SerDes) interconnects at 200 GHz or greater. As will be understood, such interconnects need to operate with high frequencies, while having low signal losses. At high frequencies, a significant majority of signal transfer occurs close to the surface of electrical conductors (e.g. electronic traces, interconnects, etc.), which is known as the "skin effect". For example, at 1 MHz, the signal transfer occurs at about 66 microns from the surface of the electrical conductors. At 28 GHz, it reduces to about 400 nanometers and at 200 GHz shrinks to about 150 nanometers. Thus, the roughness of the outer surface of electrical traces will play a significant role in signal losses at high frequencies, i.e., the smoother the outer surface, the lower the signal loss.

As will be understood by those skilled in the art, electronic substrates are generally composed of alternating layers of dielectric material (such as organic materials) and metal (such as copper) which is patterned to form conductive metal traces and formed as conductive via extending through the dielectric material layer to electrically connect the conductive metal traces. As smooth outer surfaces of the conductive metal traces are used to lower the signal loss, the adhesion between the dielectric material and the conductive metal traces becomes a technical roadblock. To address this roadblock, an adhesion promotion layer may be placed between the dielectric material layer and the conductive metal traces. Such adhesion promotion layers may comprise an organic adhesion material with oxidizing agents or direct copper ions dispersed therein, wherein the adhesion promotion layer achieves adhesion through the formation or attachment of copper ions on the conductive metal trace. In such adhesion promotion layers, the copper ions are incorporated not only at the surface of the conductive metal trace, but also throughout the 3-dimensional stack-up of the adhesion promotion layer, forming a complex irregular layer, and a myriad of 3-dimensional stacking pathways using intercalated copper ions. Such stack-ups and the presence of copper ions throughout the adhesion promotion layer causes it to be easily attacked during downstream processing by oxidizing chemistries (resulting in conductive via delamination (post-desmear) or as missing electroless metal (e.g., copper) in the conductive vias, as will be understood to those skilled in the art) and reduces the overall effectiveness of the adhesion promotion layers for the metal-to-dielectric attachment.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
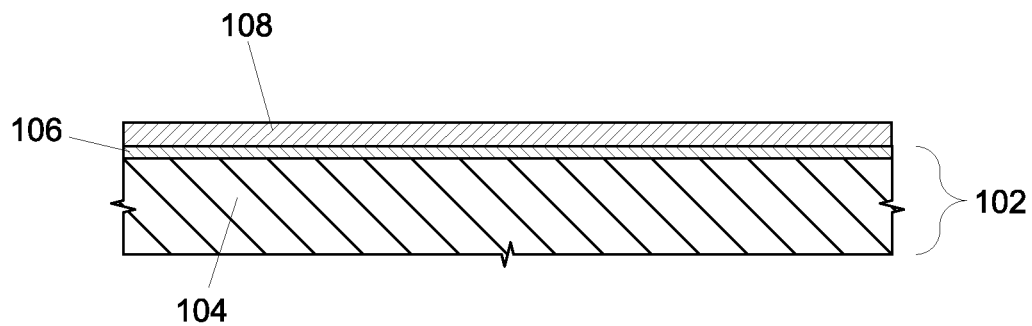
FIGS. 1-10 are side cross-sectional views of a process for the fabrication of an electronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to a metal-to-dielectric adhesion promotion material and structures formed therefrom. In one embodiment, the metal-to-dielectric adhesion promotion material may comprise an organic adhesion material and a metal constituent dispersed within the organic adhesion material. In a further embodiment, the metal of the metal constituent may have a standard reduction potential greater than 0.35 volts. The metal-to-dielectric adhesion promotion material may be used to fabricate an electronic substrate, wherein the electronic substrate may comprise a conductive metal trace, a dielectric material layer on the conductive metal trace, and the adhesion promotion material layer between the conductive metal trace and the dielectric material layer, wherein the adhesion promotion material layer comprises an organic adhesion material and a metal constituent dispersed within the organic adhesion material, wherein a metal within the metal constituent has a standard reduction potential greater than a standard reduction potential of the conductive metal trace.

FIGS. 1-10 illustrate a process for fabricating an electronic substrate 100 (see FIG. 12), according to an embodiment of the present description. FIG. 1 illustrates a carrier substrate 102 having a conductive metal layer 108 formed thereon. The carrier substrate 102 may comprise a substantially planar structure 104 with an optional interface layer 106 formed on the planar structure 104. The planar structure 104 may comprise any appropriate substantially rigid material, including but not limited to, glass, ceramic, metal, and the like. The interface layer 106 may be a material that allows for the effective removal of the electronic substrate 100 (see FIG. 10) after the fabrication thereof and/or may act as a seed or nucleation site for plating the conductive material layer 108. In an embodiment of the present description, the planar structure 104 may be a peelable core, which consists of layer of metal foils, such as copper foils, with the interface layer 106 that can be separated, for example, by mechanical means. In one embodiment, the interface layer 106 may comprise a copper foil or a seed layer. In a further embodiment, the conductive metal layer 108 may be made of any appropriate conductive material, including but not limited to, metals, such as copper, silver, nickel, gold, and aluminum, alloys thereof, and the like. The conductive material layer 108 may be formed by any known process, including but not limited to plating. Plating processes, such as electroplating and electroless plating, are well known in the art and, for purposes of clarity and conciseness, will not be discussed herein.

Figure 2:
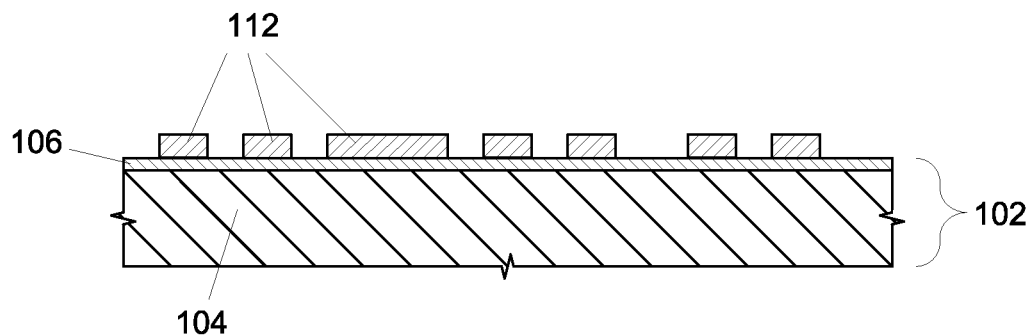

As shown in FIG. 2, at least one first level conductive metal trace 112 may be formed from the conductive material layer 108. It is understood that the term "conductive metal trace" includes conductive metal traces for forming electrical routes, via pads for landing conductive vias, and bond pads for forming conductive interconnects, as will be discussed. In one embodiment of the present description, the first level conductive metal traces 112 may be formed by selective etching of the conductive material layer 108.

Figure 3:
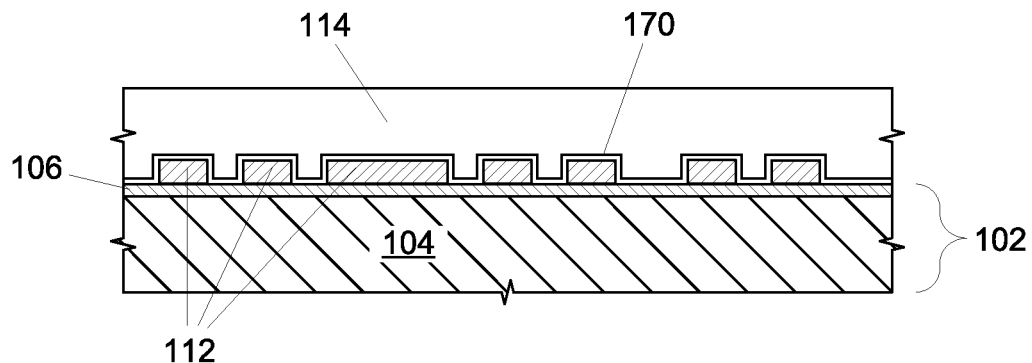

As shown in FIG. 3, a first level adhesion promotion material layer 170 may be formed on the first level conductive metal traces 112 and a first level dielectric material layer 114 may be formed on the adhesion promotion material layer 170. The adhesion promotion material layer 170 will be described in detail with regard to FIGS. 11-14. The first level dielectric material layer 114 may comprise any appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like. The first level dielectric material layer 114 may be formed by any appropriate processes, as known in the art. In one embodiment of the present description, the first level dielectric material layer 114 may be formed by lamination.

Figure 4:
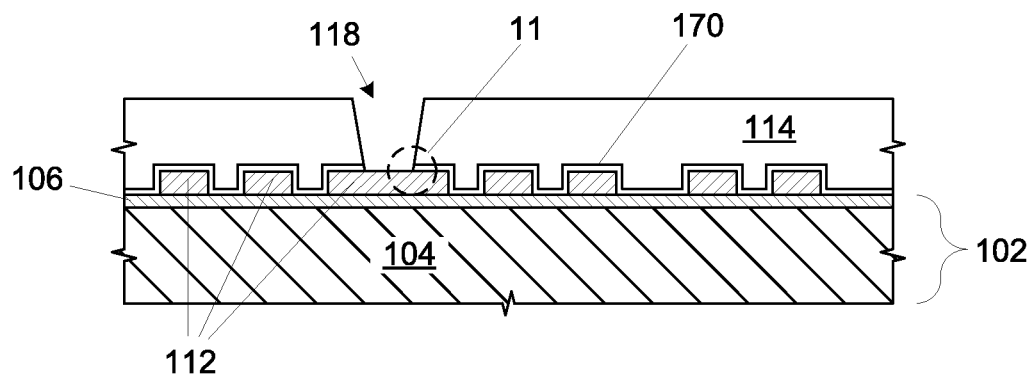

As shown in FIG. 4, at least one opening 118 may be formed to extend through the first level dielectric material layer 114 and expose at least a portion of at least one first level conductive metal trace 112. The at least one opening 118 may be formed by any technique known in the art, including, but not limited to, laser ablation, lithography/etching, and the like.

Figure 5:
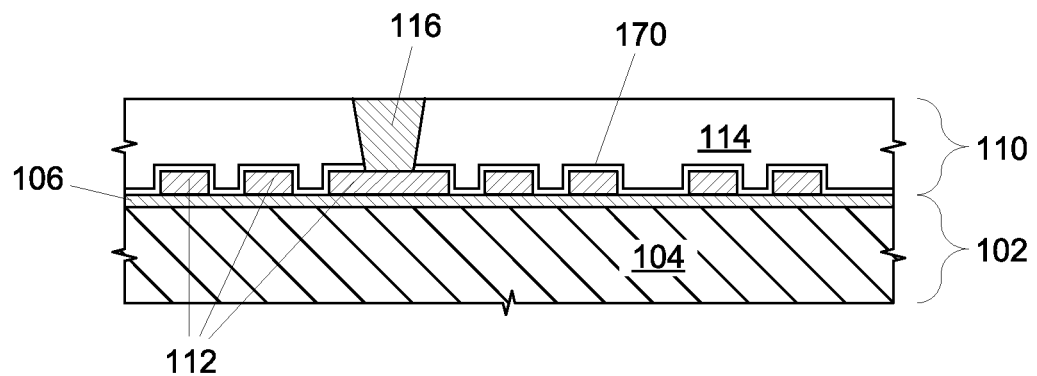
Figure 10:
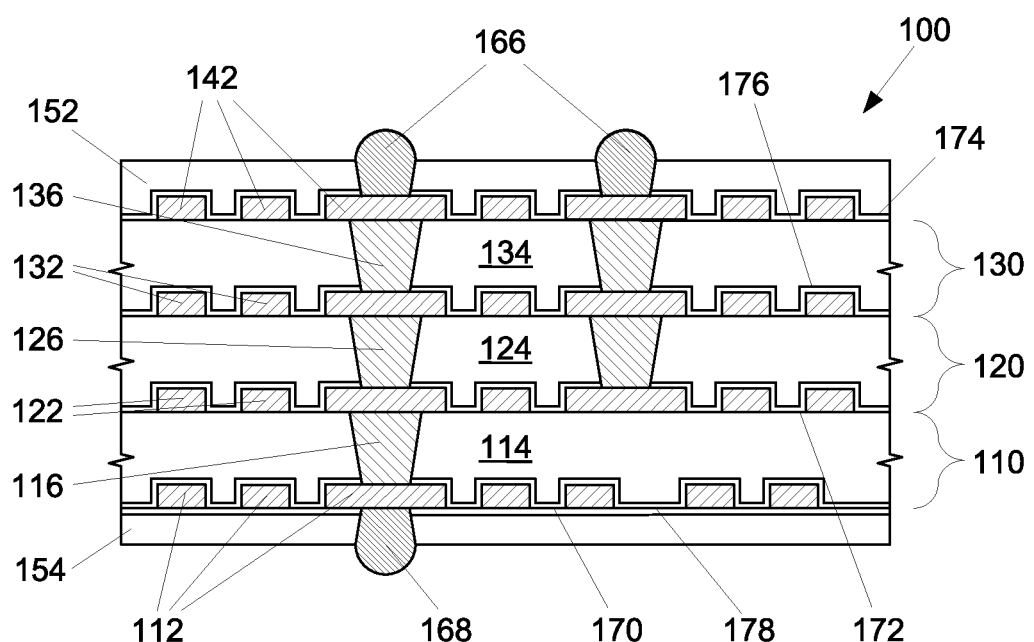

As shown in FIG. 5, at least one first level conductive via 116 may be formed to extend through the first level dielectric material layer 114, wherein the at least one first level conductive via 116 is in contact with the at least one first level conductive metal trace 112, to form a first level 110 of the electronic substrate 100 (see FIG. 10). The first level conductive via(s) 116 may be formed by any known process and material. In one embodiment of the present description, the first level conductive via 116 may be formed with a semi-additive process with photolithography. In a further embodiment of the present description, the first level conductive via(s) 116 may be made of any appropriate conductive material, including but not limited to, metals, such as copper, silver, nickel, gold, aluminum, alloys thereof, and the like.

Figure 6:
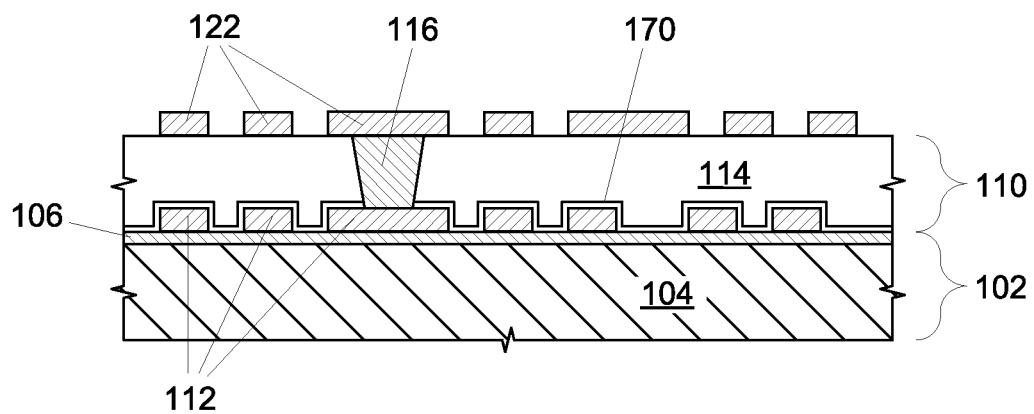

As shown in FIG. 6, the at least one second level conductive metal trace 122 may be formed on the first level dielectric material layer 114, wherein the at least one second level conductive metal trace 122 is in contact with the at least one first level conductive via 116. The second level conductive metal trace(s) 122 may be formed by any known process and material. In one embodiment of the present description, the second level conductive metal trace 122 may be formed with a semi-additive process with photolithography. In a further embodiment of the present description, the second level conductive metal trace(s) 122 may be made of any appropriate conductive material, including but not limited to, metals, such as copper, silver, nickel, gold, aluminum, alloys thereof, and the like.

Figure 7:
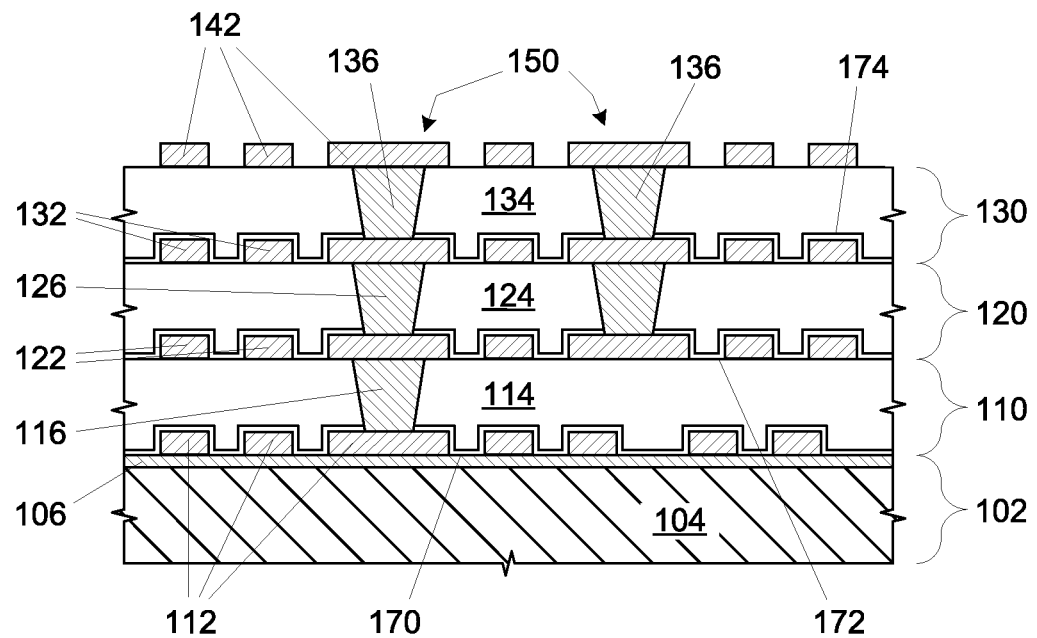

It is understood that any number of levels may be built up on the first level 110 using the same processes and materials as described with regard to the first level 110. For example, FIG. 7 illustrates two additional levels on the first level 110, i.e., a second level 120 comprising the second level conductive metal traces 122, a second level adhesion promotion material layer 172, a second level dielectric material layer 124, and at least one second level conductive via 126 extending through the second level dielectric material layer 124 to contact at least one second level conductive metal trace 122; a third level 130 comprising at least one third level conductive metal trace 132, wherein the at least one third level conductive metal trace 132 is in contact with the at least one second level conductive via 126, a third level adhesion promotion material layer 174, a third level dielectric material layer 134, and at least one third level conductive via 136 extending through the third level dielectric material layer 134 to contact at least one third level conductive metal trace 132; and at least one fourth level conductive metal trace 142, wherein the at least one fourth level conductive metal trace 142 is in contact with the at least one third level conductive via 136. For the sake of clarity and conciseness, only a few conductive metal traces 112, 122, 132, 142 and a few conductive vias 116, 126, 136 are illustrated and no fanning in or out is shown, as will be understood by those skilled in the art.

Figure 12:
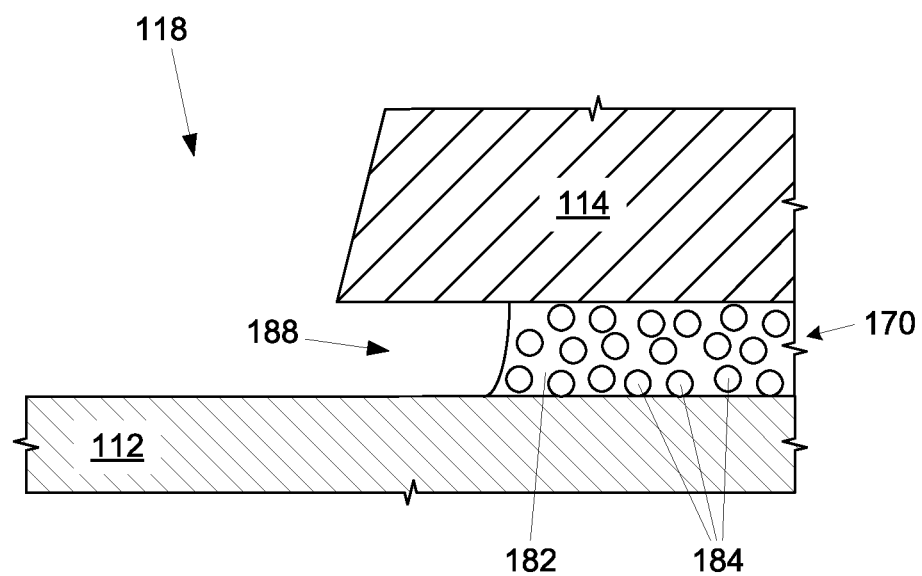
FIG. 12 is a side cross-sectional view of FIG. 11 after exposure to processing chemicals, according to an embodiment of the present description.

As will be understood by those skilled in the art, the conductive metal traces (e.g., the first level conductive metal traces 112, the second level conductive metal traces 122, the third level conductive metal traces 132, and the fourth level conductive metal traces 142) and the conductive vias (e.g., the first level conductive vias 116, the second level conductive vias 126, and the third level conductive vias 136) form conductive routes 150 or "metallization" extending through the electronic substrate 100 (see FIG. 12).

Figure 8:
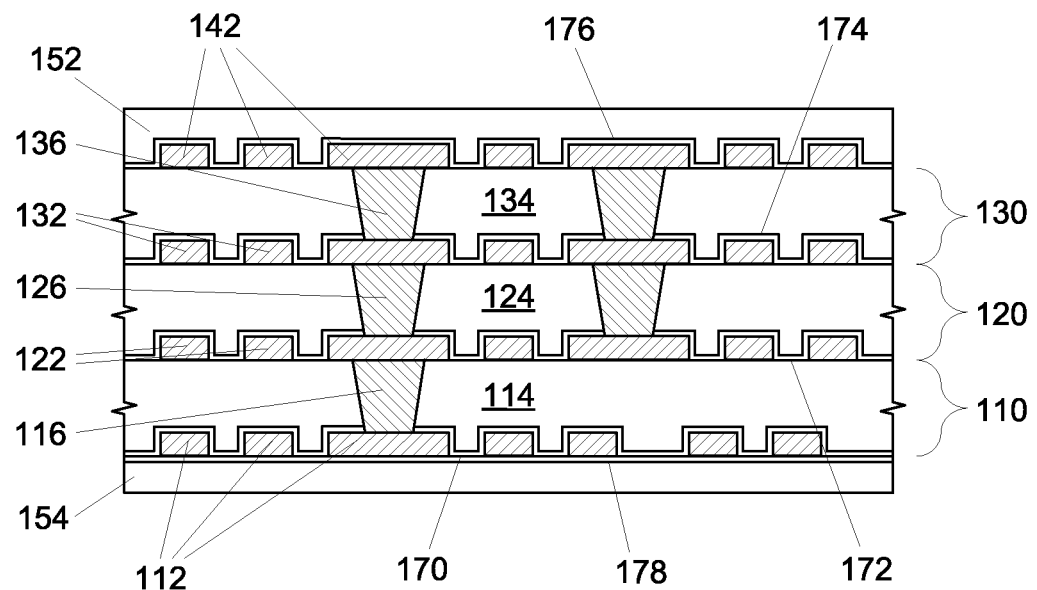

As shown in FIG. 8, the carrier substrate 102 may be removed and a land-side adhesion promotion material layer 178 may be formed on the first level conductive metal traces 112. As further shown in FIG. 8, a die-side adhesion promotion material layer 176 may be formed on the fourth level conductive metal traces 142 and the third level dielectric material layer 134, a die-side solder resist material layer 182 may be formed on the die-side adhesion promotion material layer 176, and a land-side solder resist material layer 184 may be formed on the land-side adhesion promotion material layer 178. The die-side solder resist material layer 182 and the land-side solder resist material layer 184 may be any known solder resist material, including, but not limited to polymer materials.

Figure 9:
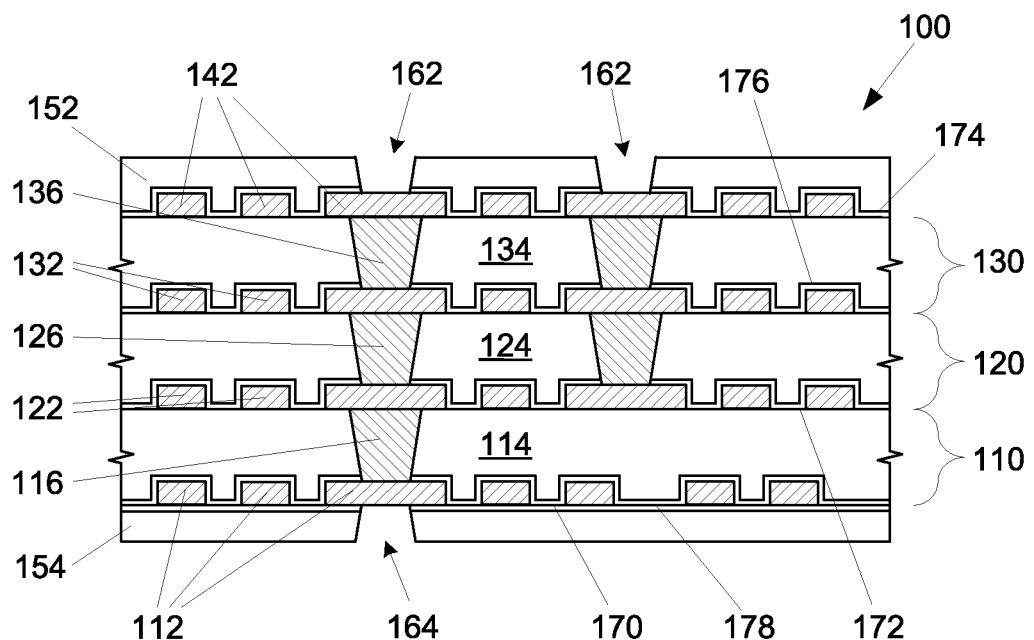

As further shown in FIG. 9, at least one die-side opening 192 may be formed in the die-side solder resist material layer 182 and the die-side adhesion promotion material layer 174 to expose at least a portion of at least one fourth level conductive metal trace 142 and at least one land-side opening 194 may be formed in the land-side resist material layer 184 and the land-side adhesion promotion material layer 178 to expose at least portion of at least one first level conductive metal trace 112.

As shown in FIG. 10, at least one die-side solder interconnect 166 may be formed in the at least one die-side opening 162 (see FIG. 9) and at least one land-side solder interconnect 168 may be formed in the at least one land-side opening 164 (see FIG. 9) to form the electronic substrate 100. In one embodiment of the present description, a surface finish (not shown), such as a nickel/palladium/gold stack layer, may be formed on the exposed portions of the fourth level conductive metal trace(s) 142 prior to forming the die-side solder interconnects 166 and/or the land-side solder interconnects 168. In another embodiment of the present description, the die-side solder interconnects 166 and/or the land-side solder interconnects 168 may be micro ball bumps formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys).

Although the embodiment of FIGS. 1-10 illustrates the formation of the electronic substrate 100 on a single side of the carrier substrate 102, it is understood that two electronic substrates could be simultaneously formed on opposing sides of the carrier substrate 102.

Figure 11:
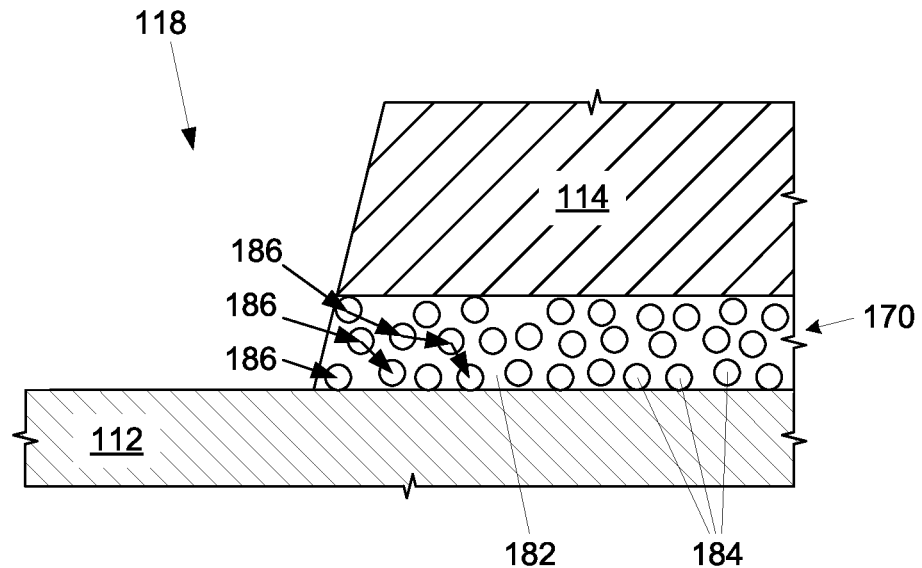
FIG. 11 is a side cross-sectional view of inset 11 of FIG. 4 of an adhesion promotion layer having a metal constituent that is substantially the same as the metal of the conductive metal traces, according to an embodiment of the present description.

FIG. 11 is a close-up of inset 11 of FIG. 4 and illustrates the interface between the first level conductive metal trace 112 and the first level dielectric material layer 114 with the first level adhesion promotion material layer 170 therebetween. The first level adhesion promotion material layer 170 (as well as any of the adhesive material layers within the electronic substrate 100 of FIG. 10) may comprise an organic adhesion material 182 with a metal constituent 184 dispersed therein. The organic adhesion material 182 may be a monomer or a polymer having at least two reactive groups (generally at alternate ends thereof), wherein one reactive group interacts with the first level dielectric material layer 114 and another reactive group interacts with the first level conductive metal trace 112. The interaction can be either ionic or covalent bonding, as will be understood to those skilled in the art. In order to promote interaction of the organic adhesion material 182 with the first level dielectric material layer 114, the metal constituent 184 may be dispersed in the organic adhesion material 182. The metal constituent 184 may comprise a metal salt or a metallo-organic complex, which facilitates the formation of metal ions at the surface of the first level conductive metal trace 112, wherein the ions facilitate the interaction of the organic adhesion material 182 to the first level conductive metal trace 112. Generally, in order to form the metal ions at the surface of the first level conductive metal trace 112, the metal ions would be the same metal as the first level conductive metal trace 112. For example, when the first level conductive metal trace 112 comprises copper, a metal salt of copper nitrate ($CuNO_3$) may be dispersed as the metal constituent 184 in the organic adhesion material 182. However, this means that the metal ions (e.g., copper ions $Cu^{2+}$) that disassociate from the metal salt are incorporated not only at the first level conductive metal trace 112, but are also dispersed throughout the first level adhesion promotion material layer 170. This may result in the first level adhesion promotion layer 170 forming into a complex, irregular film/layer having a myriad of 3-dimensional stacking pathways (shown as arrows 186 in FIG. 11) using intercalate metal ions (e.g., copper ions), as will be understood to those skilled in the art. Such 3-dimensional stacking pathways and the general presence of metal ions (e.g., copper ions) throughout the first level adhesion promotion material layer 170 results in it being highly susceptible to chemical attack during subsequent processing, such as oxidizing desmear and electroless plating chemistries, which may result in delamination 188 at the first level opening 118 (as shown in FIG. 12), may result missing electroless metal (e.g. copper) in first level conductive vias 116 (see FIG. 5), and may reduce the overall effectiveness of the adhesion of organic adhesion material 182 of the first level adhesion promotion material layer 170.

Figure 13:
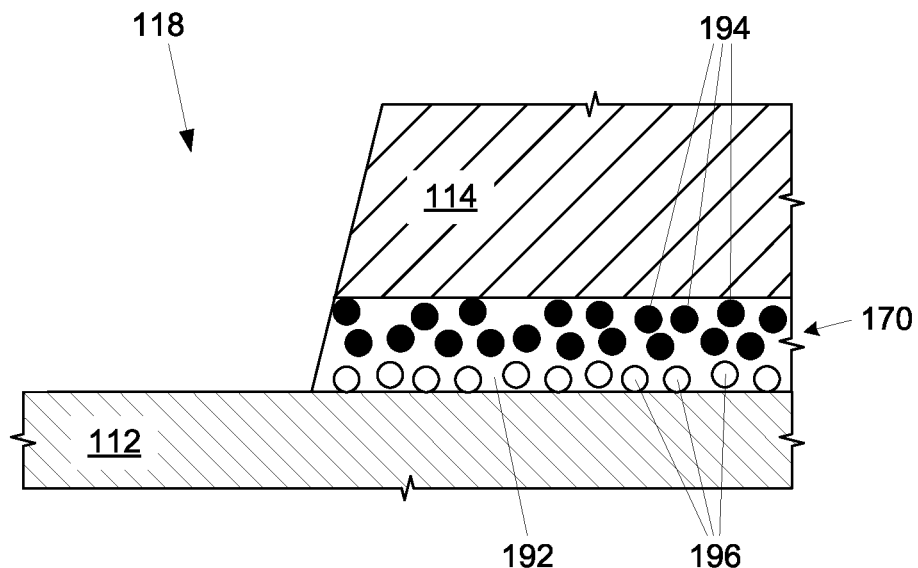
FIG. 13 is a side cross-sectional view of inset 11 of FIG. 4 of an adhesion promotion layer having a metal constituent that has a greater specific reduction voltage than a metal of the conductive metal traces, according to an embodiment of the present description.

FIG. 13 illustrates the interface between the first level conductive metal trace 112 and the first level dielectric material layer 114 with the first level adhesion promotion material layer 170 therebetween, according to an embodiment of the present description. The first level adhesion promotion material layer 170 (as well as any of the adhesive material layers within the electronic substrate 100 of FIG. 10) may comprise an organic adhesion material 192 with a metal constituent 194 dispersed therein that includes a metal that has a standard reduction potential greater than the metal used in the first level conductive metal trace 112. In one embodiment of the present description, the metal of the metal constituent may have a standard reduction potential greater than 0.35 volts. The metal constituent 194 may comprise a metal salt or a metallo-organic complex. As will be understood to those skilled in the art, standard reduction (or redox) potential is a measure of the tendency of a chemical species to acquire electrons from or lose electrons to an electrode and thereby be reduced or oxidized respectively. In one embodiment of the present description, the organic adhesion material 192 may be a monomer or a polymer having at least two reactive groups (generally at alternate ends thereof), wherein one reactive group interacts with the second level dielectric material layer 114 and another reactive group interacts with the first level conductive metal trace 112. In a specific embodiment of the present description, the organic adhesion material 192 may comprise an azole.

Having the metal constituent 194 that includes a metal that has a standard reduction potential greater (e.g., more noble) than the metal used in the first level conductive metal trace 112 will generate a localized galvanic cell at an interface between the first level conductive metal trace 112 and the first level adhesion promotion material layer 170, such that ions 196 of the metal of the first level conductive metal trace 112 are generated therefrom. Galvanic cells and reactions are well known in the art, and for the purpose of clarity and conciseness will not be described herein. In one embodiment of the present description, the first level conductive metal trace 112 may comprise copper. In another embodiment of the present description, the metal of the metal constituent 194 may be selected from the group consisting of silver, palladium, platinum, and gold. As will be understood to those skilled in the art, depending on the choice of metal in the metal constituent 194, the formation of the first level conductive via 116 may be accelerated or enhanced, when electroless metal deposition is utilized in the formation thereof. In a further embodiment of the present description, when the metal constituent 194 is a metallo-organic complex, an organic stabilizer may be included as part of the metallo-organic complex to improve stability and/or reduce chemical attack of the first level adhesion promotion material layer 170 by subsequent processing, as previously discussed. In one embodiment, the organic stabilizer may comprise a functionalized 2,2'-aminopyridine.

Figure 14:
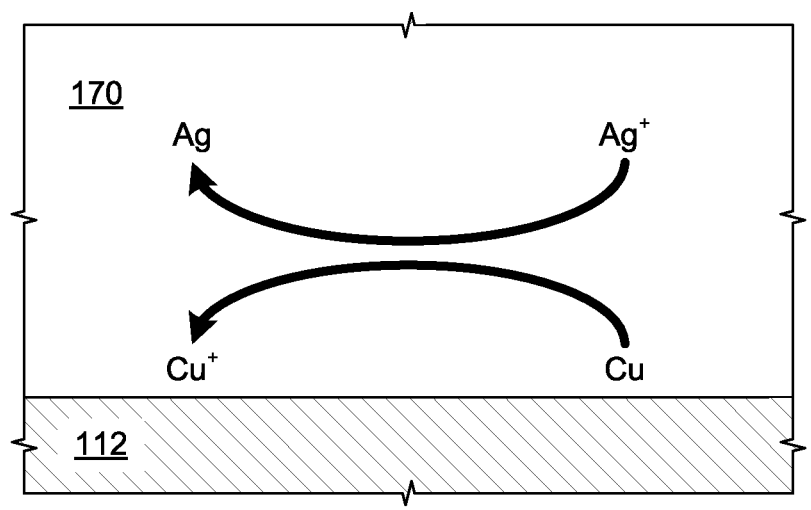
FIG. 14 is a schematic of a chemical reaction occurring in an adhesion promotion layer, according to an embodiment of the present description.

By way of an example of an embodiment of the present description, as shown in FIG. 14, the first level adhesion promotion material layer 170, comprising an azole base organic adhesion material having a metal salt such as silver nitrate ($AgNO_3$), may be formed on a first level conductive metal trace comprising copper. Since the metal ion (i.e., silver ion $Ag^+$) of the silver nitrate salt is more noble (higher standard reduction potential) than the copper metal, copper ions (elements 196 of FIG. 13 and $Cu^+$ of FIG. 14) are formed on the first level conductive metal trace 112, as the metal ions (i.e., silver ion $Ag^+$) is reduced to silver (Ag) by the following chemical equation:

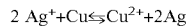

wherein $Cu^{2+}+2e^- \leftrightharpoons Cu$ (standard reduction potential of Cu=+0.34 volts)
and wherein $Ag+^+e^- \leftrightharpoons Ag$ (standard reduction potential of Ag=+0.80 volts)
This reaction is also schematically illustrated in FIG. 14.

The copper ions (elements 196 of FIG. 13 and $Cu^+$ of FIG. 14) will be entirely-consumed for attaching the organic adhesion material 192 (i.e., azole base organic adhesion material) shown in FIG. 13 to the copper trace (i.e., first level conductive metal trace 11. The lack of copper ions and the presence of ions of higher nobility than copper (i.e., silver ions) may provide resistance against attack from chemicals that are selected for processing copper in subsequent processing steps, as previously discussed.

In summary, some advantages of the embodiments of the present description may include: 1) Allowing the local production of metal ions (e.g., copper) enforced by the creation of a local galvanic cell that results in a regulated supply of metal ions (e.g., copper), thereby eliminating excess production and/or availability of these metal ions (e.g. copper); 2) Allowing for a choice of the metal (e.g. silver, palladium, platinum, and gold) of the metal constituent within the adhesion promotion material that results in accelerated or enhanced electroless metal deposition in the formation of vias; and 3) Resulting in greater resistance to oxidizing chemistry attack, such as permanganate-based desmear chemistry and oxidizing acidic electroless metal (e.g. copper) cleaner chemistries, that can greatly reduce or eliminate delamination, as previously discussed.

Although FIGS. 11-14 are directed at the first level conductive metal trace 112, the first level adhesion promotion material layer 170, and the first level dielectric material layer 114, it is understood that the embodiments of the present description may apply to any of the adhesion promotion materials 172-178 or to any situation were issues with regard to adhesion between a metal and an organic adhesion material, including, but not limited to, on-chip metallization, motherboard fabrication, and the like.

Figure 15:
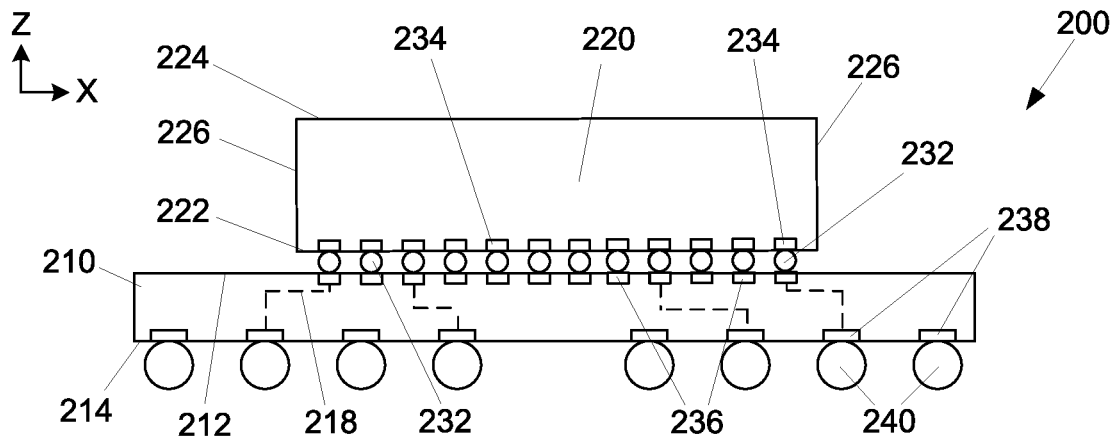
FIG. 15 is a side cross-sectional view of an integrated circuit package, according to an embodiment of the present description.

FIG. 15 illustrates an integrated circuit assembly or package 200 having at least one integrated circuit device 220 electrically attached to an electronic substrate 210 (such as electronic substrate 100 of FIG. 10) in a configuration generally known as a flip-chip or controlled collapse chip connection ("C4") configuration, according to an embodiment of the present description.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 or "metallization" (shown in dashed lines) extending through the electronic substrate 210. As will be understood to those skilled in the art, the conductive routes 218 may be a combination of conductive metal traces (not shown) and conductive vias (not shown) extending through the plurality of dielectric material layers (not shown). The electronic substrate 210 may include at least one adhesion promotion material layer, as discussed with regard to FIGS. 1-14.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 15, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

The integrated circuit device 220 may include an interconnection layer 260 at the first surface 212 thereof. The interconnection layer 260 may comprise a plurality of dielectric material layers (not shown) conductive routes 262 or "metallization" (shown in dashed lines) extending through the interconnection layer 260. As will be understood to those skilled in the art, the conductive routes 262 may be a combination of conductive metal traces (not shown) and conductive vias (not shown) extending through the plurality of dielectric material layers (not shown).

In an embodiment of the present description, the first integrated circuit device 220 may be electrically attached to the electronic substrate 210 with a plurality of device-to-substrate interconnects 232, such as the die-side solder interconnects 166 of FIG. 10. In one embodiment of the present description, the device-to-substrate interconnects 232 may extend between bond pads 236 on the first surface 212 of the electronic substrate 210 and bond pads 334 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical contact with the conductive routes 262, which may, in turn, be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240, such as the land-side solder interconnects 168 of FIG. 10, may be disposed on the bond pads 238 on the second surface 214 of the electronic substrate 210. The external interconnects 240 may be any appropriate electrically conductive material, including, but not limited to, metal filled epoxies and solders, such as tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 16:
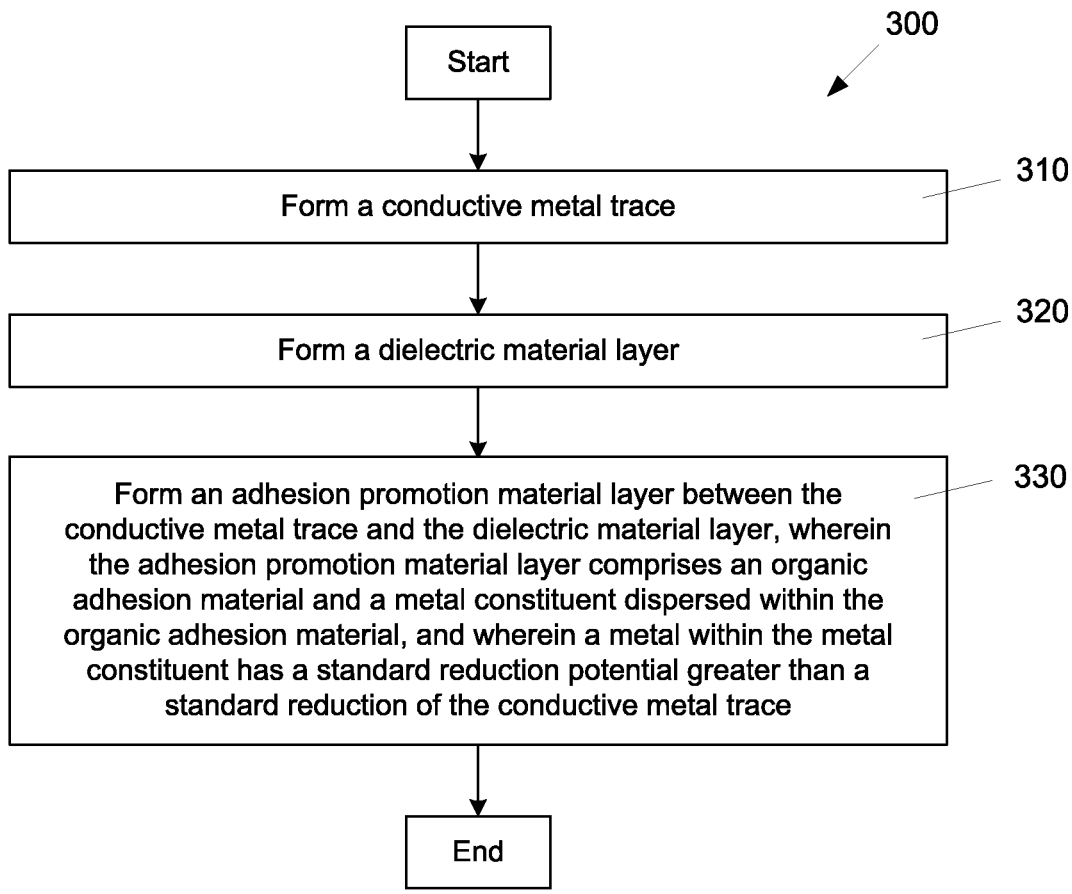
FIG. 16 is a flow chart of a process of fabricating an electronic substrate, according to still another embodiment of the present description.

FIG. 16 is a flow chart of a process 300 of fabricating an electronic substrate, according to another embodiment of the present description. As set forth in block 310, a conductive metal trace may be formed. A dielectric material layer may be formed on the conductive metal trace, as set forth in block 320. As set forth in block 330, an adhesion promotion material layer may be formed between the conductive metal trace and the dielectric material layer, wherein the adhesion promotion material layer comprises an organic adhesion material and a metal constituent dispersed within the organic adhesion material, and wherein a metal within the metal constituent has a standard reduction potential greater than a standard reduction potential of the conductive metal trace.

Figure 17:
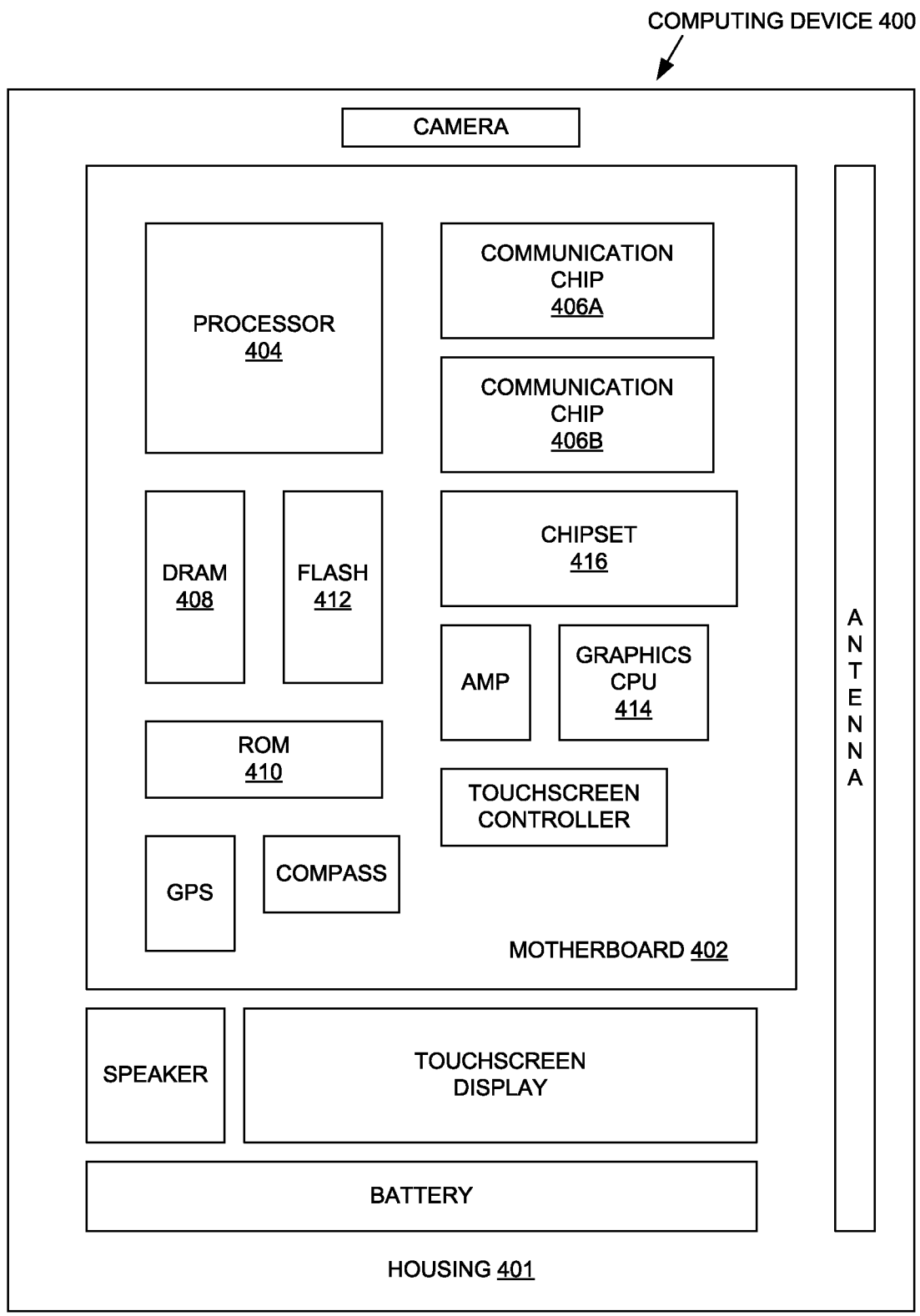
FIG. 17 is a schematic of an electronic system, according to one embodiment of the present description.

FIG. 17 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate comprises a conductive metal trace, a dielectric material layer on the conductive metal trace, and an adhesion promotion material layer between the conductive metal trace and the dielectric material layer, wherein the adhesion promotion material layer comprises an organic adhesion material and a metal constituent dispersed within the organic adhesion material, wherein a metal within the metal constituent has a standard reduction potential greater than a standard reduction potential of the conductive metal trace.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-17. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus comprising an organic adhesion material and a metal constituent dispersed within the organic adhesion material, wherein a metal within the metal constituent has a standard reduction potential greater than 0.35 volts.

In Example 2, the subject matter of Example 1 can optionally include the metal constituent comprising a metal salt.

In Example 3, the subject matter of Example 1 can optionally include the metal constituent comprising a metallo-organic complex.

In Example 4, the subject matter of Example 3 can optionally include the metallo-organic complex including an organic stabilizer.

In Example 5, the subject matter of any of Examples 1 to 4 can optionally include the metal within the metal constituent being selected from group comprising silver, palladium, and platinum.

In Example 6, the subject matter of any of Examples 1 to 5 can optionally include the organic adhesion material comprising an azole.

Example 7 is an apparatus, comprising an electronic substrate and wherein the electronic substrate comprises a conductive metal trace, a dielectric material layer on the conductive metal trace, and an adhesion promotion material layer between the conductive metal trace and the dielectric material layer, wherein the adhesion promotion material layer comprises an organic adhesion material and a metal constituent dispersed within the organic adhesion material, wherein a metal within the metal constituent has a standard reduction potential greater than a standard reduction potential of the conductive metal trace.

In Example 8, the subject matter of Example 7 can optionally include the conductive metal trace comprising copper.

In Example 9, the subject matter of any of Examples 7 to 8 can optionally include the metal constituent comprising a metal salt.

In Example 10, the subject matter of any of Examples 7 to 8 can optionally include the metal constituent comprising a metallo-organic complex.

In Example 11, the subject matter of Example 10 can optionally include the metallo-organic complex including an organic stabilizer.

In Example 12, the subject matter of any of Examples 7 to 11 can optionally include the metal within the metal constituent being selected from group comprising silver, palladium, and platinum.

In Example 13, the subject matter of any of Examples 7 to 12 can optionally include the organic adhesion material comprising an azole.

Example 14 is an electronic system, comprising an electronic board and an electronic assembly electrically attached to the electronic board, wherein the electronic assembly includes at least one microelectronic device electrically attached to an electronic substrate and wherein the electronic substrate comprises a conductive metal trace, a dielectric material layer on the conductive metal trace, and an adhesion promotion material layer between the conductive metal trace and the dielectric material layer, wherein the adhesion promotion material layer comprises an organic adhesion material and a metal constituent dispersed within the organic adhesion material, wherein a metal within the metal constituent has a standard reduction potential greater than a standard reduction potential of the conductive metal trace.

In Example 15, the subject matter of Example 14 can optionally include the conductive metal trace comprising copper.

In Example 16, the subject matter of any of Examples 14 to 15 can optionally include the metal constituent comprising a metal salt.

In Example 17, the subject matter of any of Examples 14 to 15 can optionally include the metal constituent comprising a metallo-organic complex.

In Example 18, the subject matter of Example 17 can optionally include the metallo-organic complex including an organic stabilizer.

In Example 19, the subject matter of any of Examples 14 to 18 can optionally include the metal within the metal constituent being selected from group comprising silver, palladium, and platinum.

In Example 20, the subject matter of any of Examples 14 to 19 can optionally include the organic adhesion material comprising an azole.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
  a metal trace comprising copper;
  a dielectric material layer over the metal trace; and
  a material layer between and in contact with the metal trace and the dielectric material layer, wherein the material layer comprises an organic material, a plurality of first metal constituents dispersed within the organic material over the metal trace, and a plurality of second metal constituents dispersed within the organic material over the plurality of first metal constituents, wherein the first metal constituents comprise copper and the second metal constituents comprise one of silver, palladium, platinum, and gold.

2. The apparatus of claim 1, further comprising:
  a second metal trace on the dielectric material layer, the second metal trace comprising copper;
  a solder resist material layer over the second metal trace; and
  a second material layer between and in contact with the second metal trace and the solder resist material layer, wherein the second material layer comprises the organic material and a plurality of the second metal constituents dispersed within the organic material.

3. The apparatus of claim 2, further comprising a solder interconnect on the second metal trace.

4. The apparatus of claim 1, wherein the first metal constituents comprise a metal salt or a metallo-organic complex.

5. The apparatus of claim 4, wherein the first metal constituents comprise the metallo-organic complex, the metallo-organic complex comprising an organic stabilizer.

6. The apparatus of claim 5, wherein the organic stabilizer comprises 2,2'-aminopyridine.

7. The apparatus of claim 1, wherein the organic material comprises an azole.

8. The apparatus of claim 1, comprising:
a microelectronic device and/or an electronic board coupled to an electronic substrate comprising the metal trace, the dielectric material layer, and the material layer.

9. An apparatus, comprising:
a metal trace comprising a first metal;
a dielectric material layer over the metal trace; and
a material layer between and in contact with the metal trace and the dielectric material layer, wherein the material layer comprises an organic material, a plurality of first metal constituents dispersed within the organic material over the metal trace, and a plurality of second metal constituents dispersed within the organic material over the plurality of first metal constituents, wherein the first metal constituents comprise the first metal and the second metal constituents comprise a second metal having a standard reduction potential greater than a standard reduction potential of the first metal.

10. The apparatus of claim 9, further comprising:
a second metal trace on the dielectric material layer, the second metal trace comprising the first metal;
a solder resist material layer over the second metal trace; and
a second material layer between and in contact with the second metal trace and the solder resist material layer, wherein the second material layer comprises the organic material and a plurality of the second metal constituents dispersed within the organic material.

11. The apparatus of claim 10, further comprising a solder interconnect on the second metal trace.

12. The apparatus of claim 9, wherein the first metal constituents comprise a metal salt or a metallo-organic complex.

13. The apparatus of claim 12, wherein the first metal constituents comprise the metallo-organic complex, the metallo-organic complex comprising an organic stabilizer.

14. The apparatus of claim 13, wherein the organic stabilizer comprises 2,2'-aminopyridine.

15. The apparatus of claim 9, wherein the organic material comprises an azole.

16. The apparatus of claim 9, further comprising:
a microelectronic device and/or an electronic board coupled to an electronic substrate comprising the metal trace, the dielectric material layer, and the material layer.

17. An apparatus, comprising:
a first metal trace comprising copper;
a dielectric material layer over the first metal trace; and
a first material layer between and in contact with the first metal trace and the dielectric material layer, wherein the first material layer comprises an organic material, a plurality of first metal constituents dispersed within the organic material over the first metal trace, and a plurality of second metal constituents dispersed within the organic material over the plurality of first metal constituents, wherein the first metal constituents comprise copper and the second metal constituents comprise one of silver, palladium, platinum, and gold;
a second metal trace on the dielectric material layer, the second metal trace comprising copper;
a solder resist material layer over the second metal trace;
a second material layer between and in contact with the second metal trace and the solder resist material layer, wherein the second material layer comprises the organic material, a plurality of the first metal constituents dispersed within the organic material over the second metal trace, and a plurality of third metal constituents dispersed within the organic material over the plurality of first metal constituents, the third metal constituents comprise another one of silver, palladium, platinum, and gold.

18. The apparatus of claim 17, further comprising a solder interconnect on the second metal trace.

19. The apparatus of claim 17, wherein the first metal constituents comprise a metallo-organic complex, the metallo-organic complex comprising 2,2'-aminopyridine.

20. The apparatus of claim 17, further comprising:
a microelectronic device and/or an electronic board coupled to an electronic substrate comprising the first metal trace, the dielectric material layer, the first material layer, the second metal trace, the solder resist material layer, and the second material layer.

* * * * *